(12) United States Patent
Chen et al.

(10) Patent No.: US 8,320,511 B2
(45) Date of Patent: Nov. 27, 2012

(54) CYCLE SLIP DETECTION FOR TIMING RECOVERY

(75) Inventors: Xiao-Ming Chen, Hannover (DE); Oliver Theis, Hannover (DE)

(73) Assignee: Thomson Licensing, Issy-les-Moulineaux (FR)

( * ) Notice: Subject to any disclaimer, the term of this patent is extended or adjusted under 35 U.S.C. 154(b) by 718 days.

(21) Appl. No.: 12/387,128

(22) Filed: Apr. 28, 2009

(65) Prior Publication Data

US 2009/0268857 A1    Oct. 29, 2009

(30) Foreign Application Priority Data

Apr. 28, 2008   (EP) ..................................... 08155294

(51) Int. Cl.
*H04L 7/00*    (2006.01)
(52) U.S. Cl. ........................... 375/371; 375/354; 702/69
(58) Field of Classification Search .................. 375/371, 375/354; 702/69
See application file for complete search history.

(56) References Cited

U.S. PATENT DOCUMENTS

| | | | |
|---|---|---|---|
| 5,790,613 A | | 8/1998 | Tateishi |
| 6,430,235 B1 * | | 8/2002 | O'Shea et al. ................. 375/326 |
| 6,973,150 B1 * | | 12/2005 | Thuringer ..................... 375/371 |

OTHER PUBLICATIONS

Kovintavewat P. et al: "Interpolated Timing Recovery" Coding and Signal Processing for Magnetic Recording Systems, XX, XX, Jul. 1, 2004 XP002384341 *paragraph [27.1]-paragraph [27.3] figure 27.2. European Search Report dated Aug. 12, 2008.
Nayak, Aravind R., "Iterative Timing Recovery for Magnetic Recording Channels with Low Signal-to-Noise Ratio" Doctoral Thesis, School of Electrical and Computer Engineering, Georgia Inst. of Technology, Jun. 24, 2004.

* cited by examiner

*Primary Examiner* — Sam K Ahn
*Assistant Examiner* — Leila Malek
(74) *Attorney, Agent, or Firm* — Myers Wolin, LLC

(57) ABSTRACT

A method and an arrangement for cycle slip detection for timing recovery of a received analog signal including asynchronously sampled digital data are implemented with a timing recovery control loop using a technique known as interpolated timing recovery and improved cycle slip detection as well as improved cycle slip correction based on said cycle slip detection. The method includes using an output signal of the loop filter in the control loop for timing recovery, generating averaged timing error values from said filtered timing error signal and accumulating changes of the averaged timing error values in adjacent blocks of samples which exceed a first threshold. Accumulated averaged timing error changes of adjacent blocks which exceed a second threshold are then declared as cycle slip and the number of cycle slips is determined by a third threshold being a tolerance threshold.

13 Claims, 8 Drawing Sheets

CYCLE SLIP DETECTION FOR TIMING RECOVERY

This application claims the benefit, under 35 U.S.C. §119 of European Patent Application 08155294.5, filed Apr. 28, 2008.

FIELD OF THE INVENTION

The present invention relates to a method and an arrangement for cycle slip detection for timing recovery, more specifically a fully digital implementation of a timing recovery control loop using a technique known as interpolated timing recovery and improved cycle slip detection as well as improved cycle slip correction based on said cycle slip detection.

BACKGROUND OF THE INVENTION

It is the purpose of timing recovery to convert an asynchronously sampled read-out signal to a baud rate synchronous signal, which e.g. is used for bit detection, runlength limited decoding or joint bit detection and runlength limited decoding or subsequent channel decoding. A fully digital implementation of timing recovery control loop using a technique known as interpolated timing recovery abbreviated as ITR already has been disclosed by P. Kovintavewat et al, "Interpolated timing recovery", in CRC Handbook of Coding and Signal Processing for Magnetic Recording Systems, pp. 27-1-27-16, 2005 as shown in FIG. 1.

With increased density, magnetic and optical storage systems exhibit high intersymbol interference and low signal to noise ratios, which makes timing recovery more challenging. Associated with increased intersymbol interference and decreased signal to noise ratios, the probability of cycle slips increases, i.e. samples after the timing recovery are shifted as ideal samples to the left or to the right by one or multiple bits. Due to loss of bit synchronization, cycle slips result in burst errors. A cycle slip detector and phase locked loop circuit and digital signal reproducing apparatus using the same already have been disclosed in U.S. Pat. No. 5,790,613A1. Zero-crossings of the read-out signal are employed for phase error detection to estimate timing phase errors and to detect cycle slips by examining two adjacent zero-crossings. However, zero-crossing based timing recovery is expected to perform poor under intersymbol interference and low signal to noise ratio conditions, because zero-crossings of the read-out signal do not provide reliable timing information under such conditions. Moreover, two adjacent instantaneous timing errors are compared to fixed thresholds in order to detect cycle slips, which may be sensitive to erroneously estimated timing error and may result in false alarms in the presence of frequency offset.

Furthermore, cycle slip detection using low pass filtering already has been disclosed by Thuringer in U.S. Pat. No. 6,973,150 B1. A phase detector output and a filtered phase difference compared to a threshold are used for cycle slip detection. An analog phase-locked loop with two carriers and an analog phase detector are used to determine a phase difference. A simple approach to detect cycle slips was proposed in A. Nayak's dissertation "Iterative Timing Recovery for Magnetic Recording Channels with Low Signal-to-Noise Ratio," page 139, 2004. Specifically, if the difference between the currently estimated timing error and its delayed version is larger than a fixed threshold, then a cycle slip is detected. Wrongly estimated timing errors result in false detection of cycle slips. Moreover, frequency offsets may also cause false alarms.

SUMMARY OF THE INVENTION

It is an aspect of the invention to improve cycle slip detection for a fully digital implementation of a timing recovery unit especially in the presence of intersymbol interference, low signal to noise ratio and frequency offset.

It is a further aspect of the invention to improve overall system performance by an appropriate cycle-slip compensation based on detected cycle slips.

It has been found that the output from a loop filter in a fully digital implementation of a timing recovery control loop is more suitable to track the timing error trajectory and to correct cycle slips in comparison to prior art using timing errors from a timing error detector for timing recovery.

That means, it is recommended to form averaged timing errors from the output signal of the loop filter in a fully digital implementation of a timing recovery control loop and to compare changes of successive averaged timing errors with a first threshold. Changes of the averaged timing error values in adjacent blocks of filtered timing errors which exceed the first threshold are accumulated and accumulated averaged timing error changes of adjacent blocks which exceed a second threshold are used for cycle slip detection. A predetermined evaluation window forming blocks of filtered timing errors is used to form averaged timing errors from the output signal of the loop filter. The evaluation window size is dependent on loop filter parameters and also the thresholds have to be selected correspondingly. Fast timing error changes are eliminated by forming said average values and cycle-slip detection is performed by comparing accumulated average value changes with said second threshold which can be selected in a range between 0.5 and 1 dependent on expected amplitude variations. However, it has been found that 0.6 is a very well performing value for said second threshold. The averaged timing errors are accumulated in such a way that only significant timing error changes in the same direction which exceed or reach a threshold are taken into account to perform cycle-slip detection. Averaged timing error changes of filtered timing errors in adjacent blocks are compared and the result of said comparison is reset to zero if the difference not exceeds or reaches the first threshold. Therefore, only locally significant changes are evaluated. Furthermore, a third threshold is employed to avoid a false determination of the cycle-slip size i.e. a false determination of the number of bit shifts during successive changes in the same direction.

When a cycle slip is detected, sign and magnitude of the accumulated timing error change are used to determine direction and size of a cycle slip. Finally, sample insertion or sample deletion is carried out for cycle-slip compensation based on cycle-slips detected and determined according to the recommended cycle-slip detection.

At a first glance it seems not to be an appropriate way to perform cycle-slip detection by using averaged timing errors and taking into account only significant timing error changes in the same direction as obviously timing errors changes are expected in both directions, only significant timing error changes derived from average values reduce the resolution and it may be expected that evaluating only significant timing error changes in the same direction avoids to determine reliably number and direction of cycle slips.

The problem associated with the number of cycle slips is that a relatively small first threshold for cycle slip detection from the averaged timing error has to be selected and in the worst case a continuous change of 0.6 in the averaged timing error will be detected as two successive cycle slips, while actually there is only one.

However, it has been found that it is possible to derive the direction from a sign resulting from a comparison of a current averaged timing error with a previous averaged timing error and to determine the number of cycle slips by using a third threshold as a tolerance threshold. The recommended method and arrangement provide improved cycle slip detection and cycle slip correction due to robustness against noise and inappropriately chosen timing loop parameter, applicability for systems with frequency-offsets as well as an improved signal integrity and system performance. On reason for an improvement due to the recommended solution is based on the fact that the loop filter in the timing recovery control loop is a low-pass filter, which already filters out timing error estimation noise to some extent and consequently increases the system robustness against noise. However, the output signal of the loop filter shows a lot of fluctuations which disturb a correct evaluation so that significant changes of averaged timing errors are used for cycle slip detection although at a first glance it could be assumed that it has a negative impact on the detection of direction and number of cycle slips. On the other hand, said averaged timing errors are more suitable to detect more reliable cycle slips per se due to said fluctuations in the output signal of the loop filter.

For timing recovery, a first-in, first-out memory is added, wherein sample insertion or sample deletion is controlled according to cycle slips detected and determined according to the recommended cycle slip detection. That means that timing recovery is advantageously performed reliable in the sample domain instead in the time domain having a broad Gaussian distribution with a corresponding error rate. According to an embodiment of the invention, applicable with channel knowledge, as e.g. for magnetic and optical storage systems, a partial response equalizer is embedded in the interpolated timing recovery loop. The equalizer shapes the overall channel impulse response up to a desired partial response target, so that the equalizer equals to the convolution of channel bits with the partial response target plus filtered additive noise. The re-sampling timing at the interpolator is adjusted by a digital phase locked loop comprising a timing error detector, a loop filter, and a numerically controlled oscillator and cycle slips are corrected by said first-in, first-out memory.

Advantages of the proposed method and arrangement for cycle slip detection for timing recovery are reliability and increased robustness against noise and inappropriately chosen timing loop parameters, applicability for systems with frequency-offsets as well as an improved signal integrity and system performance.

For a better understanding of the invention, an exemplary embodiment is specified in the following description with reference to accompanied drawings.

BRIEF DESCRIPTION OF THE DRAWINGS

Exemplary embodiments of the invention are described with reference to the accompanying drawings, which show in FIG. 1 a block diagram of a fully digital implementation of a timing recovery control loop for interpolated timing recovery known from prior art, FIG. 2 a diagram of the signal at the output of the loop filter in a timing recovery control loop for interpolated timing recovery, FIG. 3 a flow chart illustrating a method for detecting cycle slips according to the invention, FIG. 4 a diagram of filtered timing error and its average, FIG. 5 a diagram comprising cycle slips wrongly detected from averaged timing errors shown in FIG. 4, FIG. 6 a diagram of filtered timing error and its average, FIG. 7 a diagram of cycle slips detected according to the invention from averaged timing errors shown in FIG. 6, FIG. 8 a block diagram of an exemplary arrangement for detecting and correcting cycle slips, FIG. 9 a flow chart illustrating a method for detecting direction and number of cycle slips, FIG. 10 a block diagram of an exemplary arrangement for detecting and correcting cycle slips with channel knowledge, FIG. 11 a diagram of a noiseless partial response reference signal and a signal at the output of a partial response equalizer, illustrating a first cycle slip in FIG. 2, FIG. 12 a diagram of a noiseless partial response reference signal and a signal at the output of a partial response equalizer illustrating a second cycle slip in FIG. 2 and, FIG. 13 block diagram of a cycle slip detector and a cycle slip size evaluator.

DETAILED DESCRIPTION

Like numerals and characters designate like elements throughout the figures of the drawings.

Figure 1:
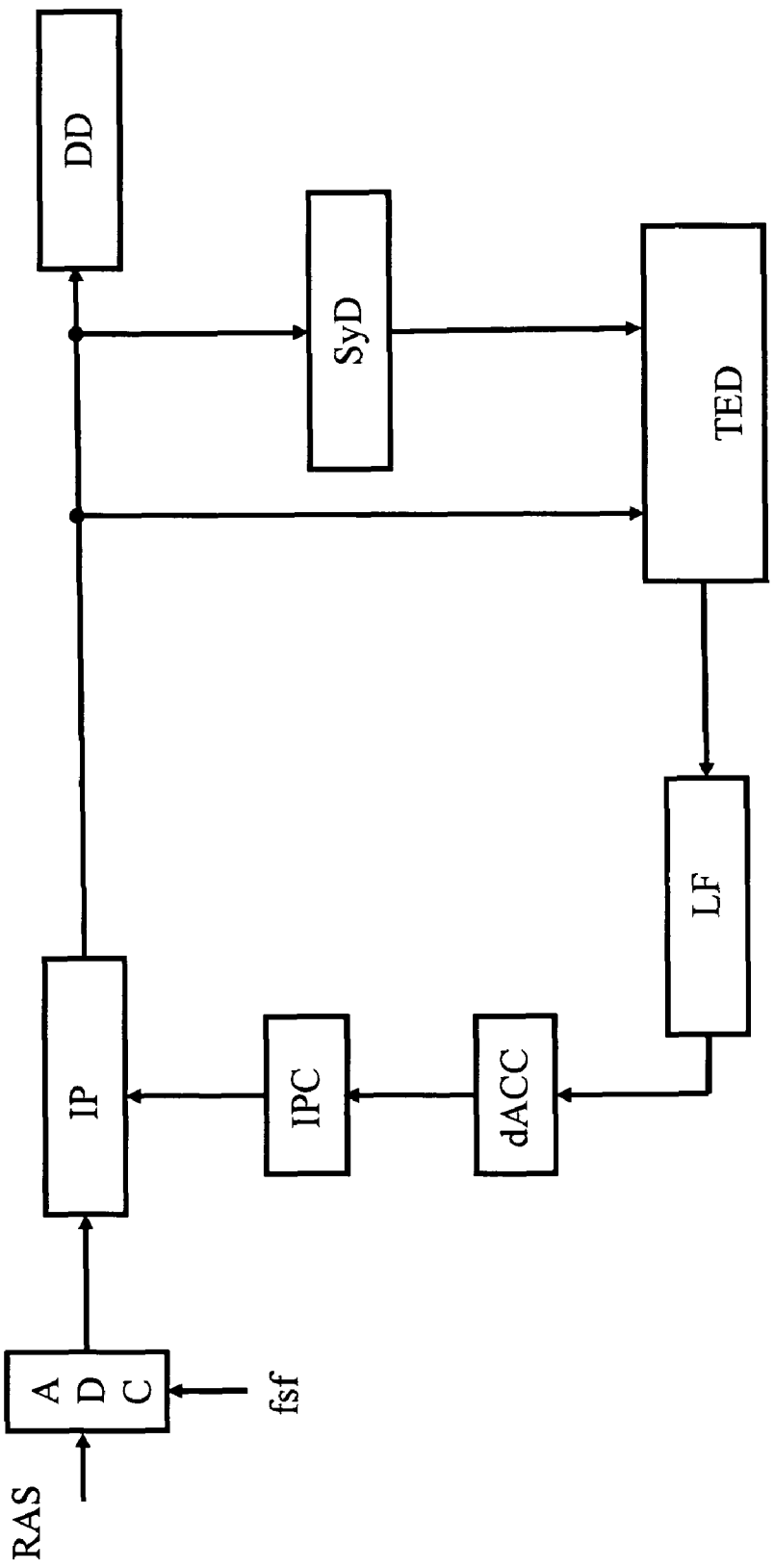
Figure 2:
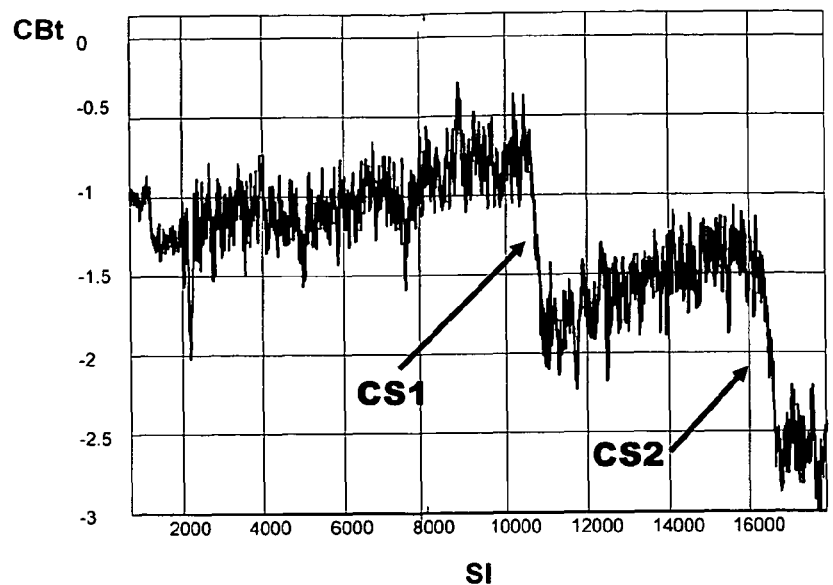

Reference is initially directed to FIG. 1, which generally illustrates the basic portions of a fully digital implementation of a timing recovery control loop for interpolated timing recovery as disclosed in FIG. 27.2 by P. Kovintavewat et al, "Interpolated timing recovery", in CRC Handbook of Coding and Signal Processing for Magnetic Recording Systems, 2005, pp. 27-1-27-16. A received analog signal RAS comprising digital data as e.g. provided by reading a high-density data storage medium or received by mobile phone is applied to an analog digital converter ADC having a fixed sampling frequency fsf, which means that the received signal is asynchronously sampled. The advantage of asynchronous sampling is that the sampling frequency does not need to be a multiple of the symbol frequency and a system known as interpolated timing recovery is employed for timing adjustment to obtain synchronized samples without or small oversampling e.g. 5% due to high data rates. A fully digital timing recovery circuit as shown in FIG. 1 comprises serially connected said analog digital converter ADC, an interpolator IP and a data detector DD as well as an interpolation control loop comprising the interpolator IP. The interpolation control loop comprises a timing error detector TED being direct and via a symbol detector SyD connected to an output of the interpolator IP, a loop filter LF, a digital accumulator dACC to update a next sampling phase offset and an interpolator control unit IPC connected to the interpolator IP. Fully digital timing recovery circuits based on interpolation filters are designed in view of a minimum mean-squared error approach. Nevertheless, the analysis disclosed by P. Kovintavewat et al. already shows that such systems are sensitive in the presence of intersymbol interference, low signal to noise ratio and frequency offset. This is confirmed by a diagram shown in FIG. 2, which illustrates the signal at the output of the loop filter LF in a timing recovery control loop for interpolated timing recovery according to FIG. 1 wherein cycle slips CS1 and CS2 are present. Cycle slip means that received samples are shifted to the left or to the right by one or multiple bits as ideal samples after timing recovery. As shown in FIG. 2, the asynchronously sampled receive signal RAS causes variations in the filtered timing error normalized with respect to the channel bit duration CBt dependent on sample index SI at the output of the loop filter LF in the interpolator control loop.

Figure 10:
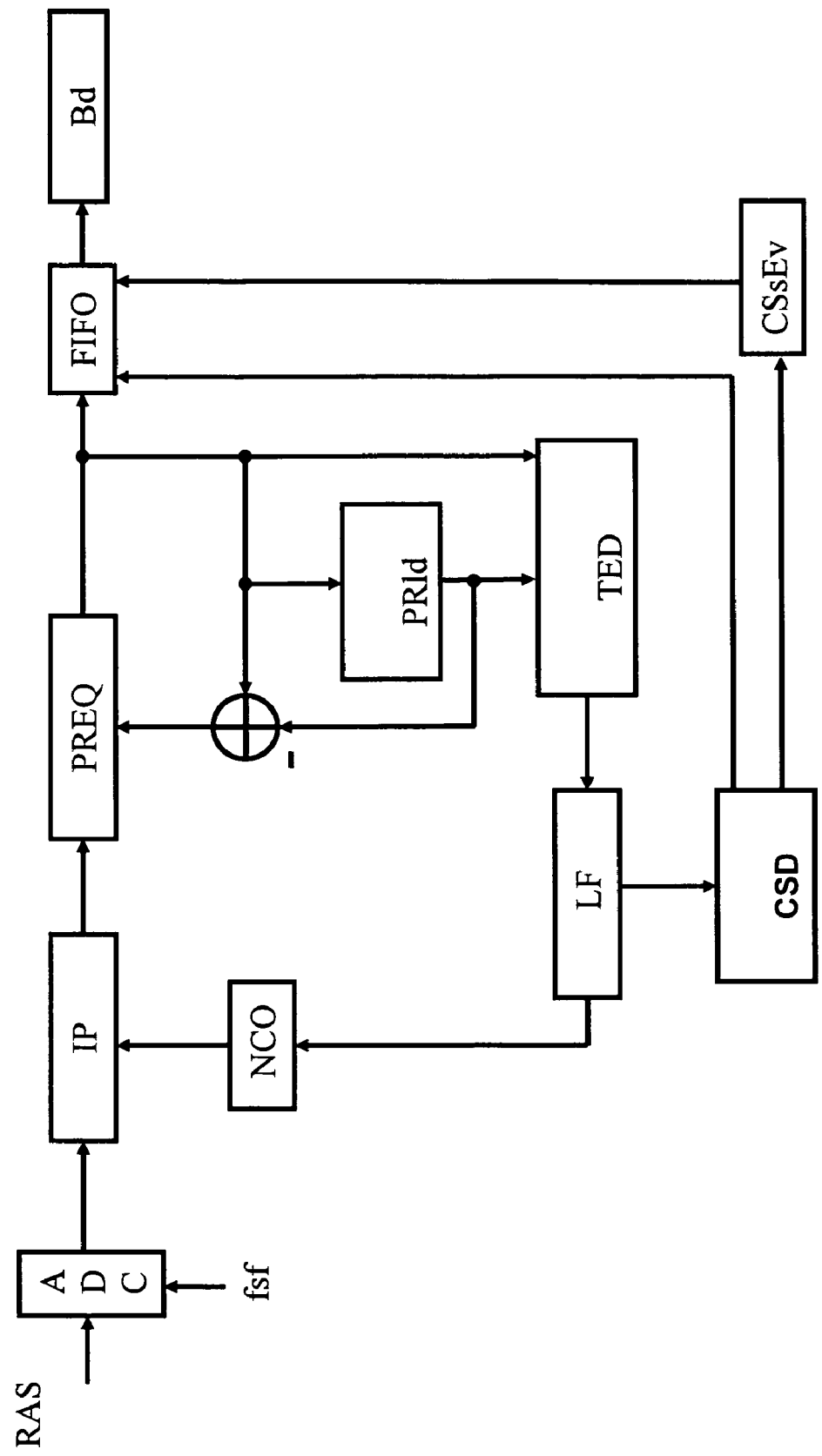
Figure 12:
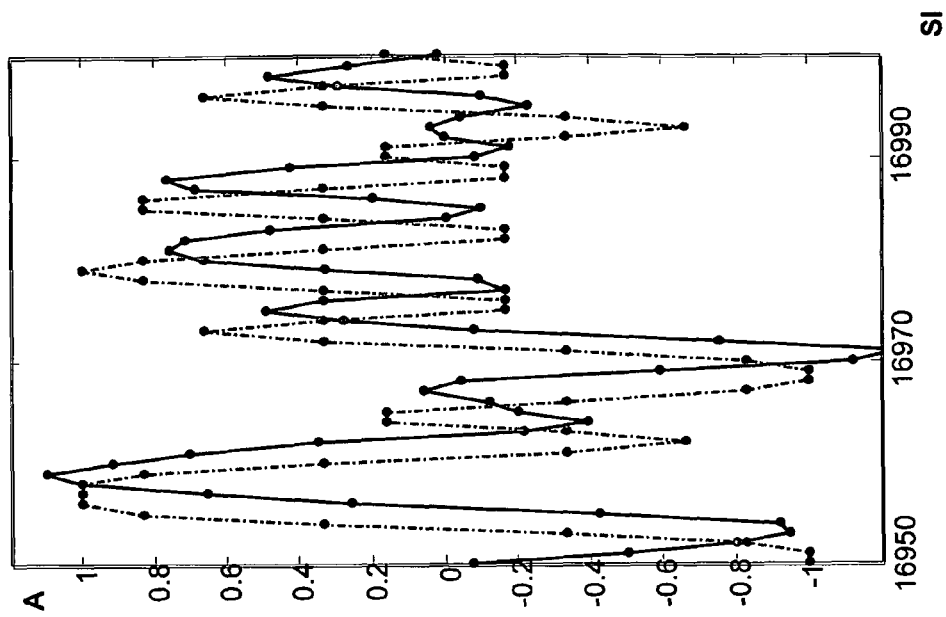
Figure 11:
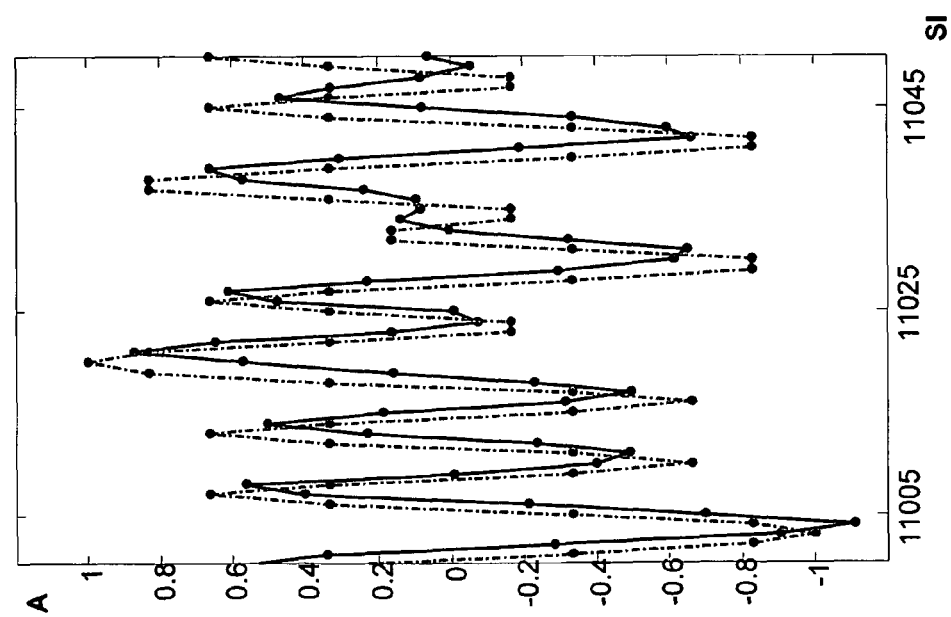

Significant changes in the filtered timing error or so-called channel bit time error after the loop filter LF illustrate cycle slips CS1, CS2. FIG. 2 illustrates that continuously significant changes occur in the filtered timing error after the loop filter LF if there is a cycle slip in the output signal of the interpolator IP. For evidence that there are cycle slips CS1, CS2, as indicated in FIG. 2, a partial response equalizer PREQ has been connected to the interpolator IP as shown in FIG. 10 and a comparison of the partial response equalizer output signal with a partial response reference signal for corresponding sample indexes SI is shown in FIG. 11 and FIG. 12. The equalizer output signal is illustrated by a solid line and dashed lines indicate the noiseless partial response reference signal. FIG. 11 and FIG. 12 show amplitude values A of the signal at the output of the partial response equalizer PREQ in FIG. 10 related to sampling indexes SI in the area of cycle slips CS1, CS2 shown in FIG. 2. The shift of amplitude values A to a different sampling index SI in FIG. 11 indicates a first cycle slip CS1 shown in FIG. 2 and a cycle slip of two samples shown in FIG. 12 corresponds to a cycle slip CS2 in FIG. 2. Said FIG. 2 also shows that the timing recovery loop tracks timing variations slow due to frequency offset caused by frequency estimation errors. Such frequency estimation error may be e.g. caused by a quantization error of a fixed-point implementation. Further sources for a frequency estimation error are e.g. disc revolution speed variations due constant angular velocity. It is also obvious from FIG. 2 that many amplitude values will be wrongly detected, if a fixed threshold is used and instantaneous filtered timing errors are compared to a fixed threshold. Furthermore, in addition to slow timing variation in the filtered timing error in case of a conventional partial response maximum-likelihood system, there is a fast changing portion caused by residual equalization error and/or noise.

Figure 8:
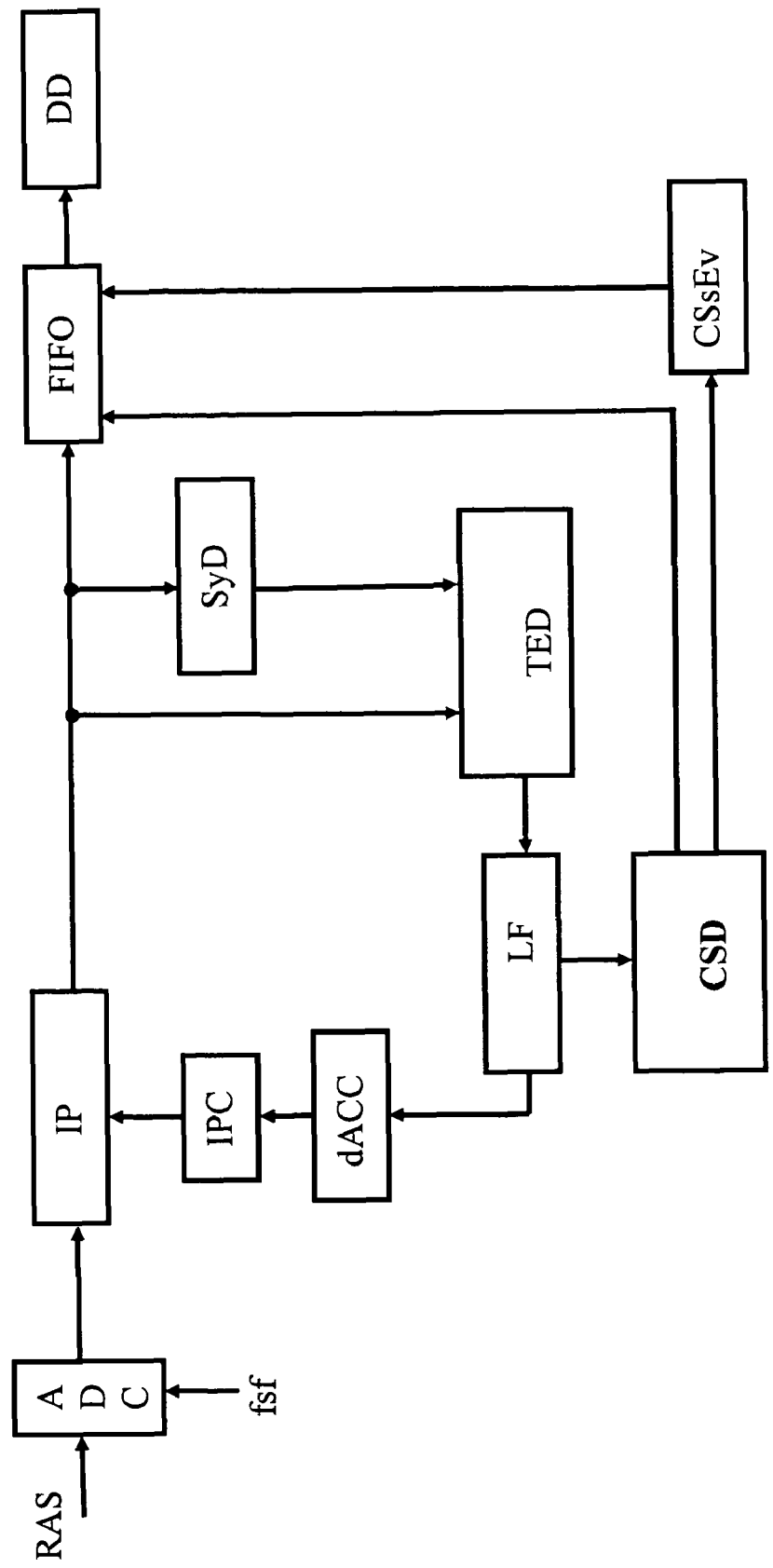

For the reasons mentioned above, improved cycle slip detection for a fully digital implementation of a timing recovery control loop and appropriate cycle slip compensation based on detected cycle slips are recommended. Embodiments of arrangements for the improved cycle slip detection as well as a correction of cycle slips based on the improved cycle slip detection are illustrated by block diagrams in FIG. 8 and FIG. 10. The embodiment shown in FIG. 8 comprises all elements already known from FIG. 1 and in addition a cycle slip detector CSD connected to an output of the loop filter LF in the interpolator control loop as well as a first-in, first-out memory FIFO arranged between interpolator IP and data detector DD. The first-in, first-out memory FIFO is furthermore connected to cycle slip detector CSD for controlling the first-in, first-out memory FIFO via a direct line as well as via a cycle slip size evaluator CSsEv providing the number of detected cycle slips. Said additional elements in FIG. 8 are in the same manner also arranged in the embodiment according to FIG. 10 because the general principle of the invention is based on using the output signal of the loop filter LF in the interpolator control loop for cycle slip detection. The cycle slip detector CSD comprises means for averaging the filtered timing errors provided at the output of the loop filter LF. Therefore, the filtered timing error signal is divided into blocks and averaged timing errors are evaluated for these blocks. The block length can be selected as 2^M with M as a positive integer, so that averaging is accomplished by simple right shifting and may be realized by an efficient hardware implementation. For that case, averaging can be performed by means of an accumulator and a counter, wherein the accumulator accumulates the filtered timing errors and the counter decides when to perform shifting i.e. averaging. That means that averaging may be realized by an efficient hardware implementation. Fast changing variations in the filtered timing error are successfully suppressed by averaging the filtered timing errors. Moreover, averaging can be interpreted as a simple filtering method. Alternatively, different filtering methods as e.g. a low pass filter rather than the averaging mentioned above may be employed to suppress fast changing variations, while averaging provides a simple and effective solution. Averaging means that a predetermined evaluation window forming blocks of filtered timing errors is used to form averaged timing errors from the output signal of the loop filter. The evaluation window size is dependent on loop filter parameters as the phase dependent gain part of the control loop and the damping factor for noise suppression which means dependent on the influence of loop filter gains on the timing phase error and also the thresholds have to be accordingly selected as it will be described below in more details. In the following, the term filtered timing error is used to describe that the timing error at the output of the loop filter LF in the interpolator control loop is meant. The averaged timing errors are accumulated in such a way that only significant timing error changes in the same direction which exceed a threshold are taken into account to perform cycle slip detection. Said accumulation means that averaged timing error changes are compared and the result is reset to zero if the difference not exceeds a first and a second threshold. Therefore, only locally significant changes representing at least a cycle slip of one bit are detected.

Figure 3:
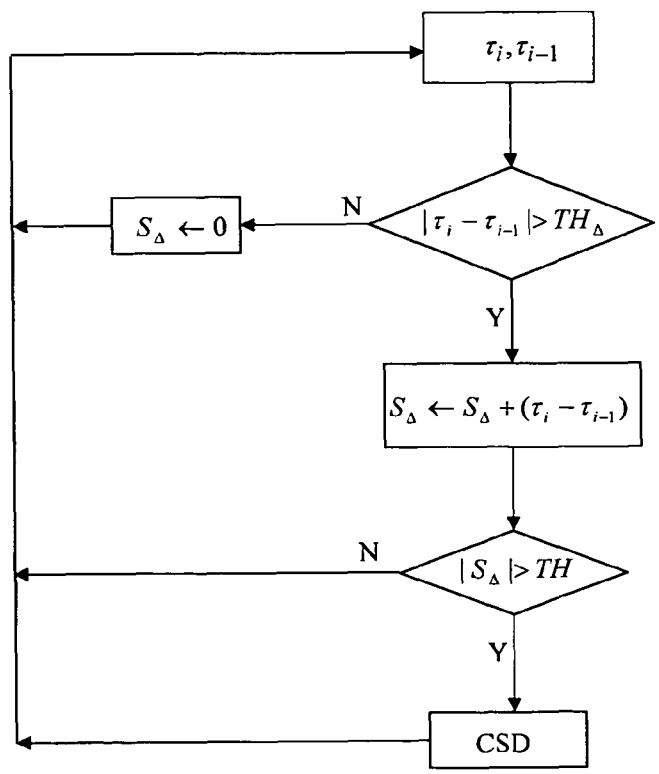

The method for cycle slip detection is illustrated by a flowchart shown in FIG. 3, wherein i denotes a block index i, $\tau_i$ denotes the averaged filtered timing error for the i-th block, and $S_A$ denotes the accumulated change in the averaged timing errors as a cycle slip indicator. FIG. 3 illustrates a method as an example for a compact presentation, while a recursive implementation is also possible, as for averaging filtered timing errors. The cycle slip detection CSD based on averaged filtered timing errors being accumulated is carried out with following steps as shown in FIG. 3:

1. Initialization: i=1, $\tau_0$=0, $S_A$=0, where $\tau_0$ is introduced only for consistence of $\tau_i-\tau_{i-1}$ to deal with the first block.

2. If there is a significant change with respect to the averaged filtered timing error between two adjacent blocks, i.e., $|\tau_i-\tau_{i-1}|>TH_A$, wherein $TH_A$ designates a first threshold, then go to step 4 otherwise reset an accumulated change of an average of filtered timing errors $S_A$=0.

It is also possible to define two first thresholds $+TH_A$ and $-TH_A$ for changes in two directions. That is, $\tau_i-\tau_{i-1}$ is compared to a positive first threshold if $\tau_i-\tau_{i-1}$ is positive; otherwise, $\tau_i-\tau_{i-1}$ is compared to a negative first threshold. And these two first thresholds $+TH_A$, $-TH_A$ in addition may be selected with different magnitudes and the sign indicates the direction.

3. Increase the block index i=i+1, go to step 2.

4. Update accumulated timing error change: $S_A=S_A+(\tau_i-\tau_{i-1})$. The update of the accumulated change in the averaged timing errors $S_A$ may have different sign from that of $(\tau_i-\tau_{i-1})$ which reduces the influence of fluctuations from previous blocks on the currently evaluated block, so that only significant changes in the same direction which reliably indicate a cycle slip will be evaluated.

5. Check the cycle-slip condition: If the magnitude of an accumulated change of averaged timing errors $S_A$ is larger than a second threshold TH, declare a cycle slip as detected by cycle slip detector CSD and reset $S_A$=0. Afterwards go to step 3.

That means that averaged timing error changes are compared and the accumulated averaged timing error change is reset to zero if the difference not exceeds a first threshold.

Therefore, only locally significant changes in the same direction reliably representing at least a cycle slip of one bit are detected. As mentioned above, also two second thresholds TH may be employed to detect cycle slips in positive or negative direction by the sign. The first threshold $TH_A$ and the second threshold TH have to be selected in view of the parameters of the control loop for timing recovery, which is a digital phase lock loop abbreviated DPLL. The loop filter LF in such control loops is typically a second-order loop filter handling both phase and frequency errors. That means one bit-slip normalized with respect to channel bit duration indicates a timing phase error of one and the time that a control loop needs to make such a timing phase change is approximately equal to $2\pi/\omega_d = 2\pi/\sqrt{K_f}$ if normalized with respect to channel bit duration, wherein $K_f$ is the frequency dependent gain part of a damping factor for noise suppression $\zeta = K_p/(2\sqrt{K_f})$ and $K_p$ is the phase dependent gain part of the control loop. That means for example for a given control loop which has a damping factor for noise suppression $\zeta = 1.5$ and a phase dependent gain part $K_p = 0.003$ that the control loop needs a normalized time to make such a timing phase change corresponding to $2\pi/\omega_d \approx 628$. Consequently one bit-slip corresponds to 628 samples and an evaluation window has to be determined taking into account said number of samples. Furthermore, accumulated changes of timing errors shall be compared with said second threshold for cycle slip detection, so that said second threshold has to be selected in a range between 0.5 and 1. Related to the exemplary embodiment a value for the second threshold TH=0.6 has been found as sufficient for a reliable detection. That means that in case that e.g. four accumulated changes shall be used for cycle slip detection, the first threshold $TH_A$ has to be a quarter of the second threshold TH and the window size has to be approximately 628/4=157 samples. Alternatively, e.g. a window size of 628/8≈78 samples may be selected and then the first threshold $TH_A$ has to be selected as 0.075. For simple implementation, a window size of $2^M$ can be employed. Therefore in the examples mentioned above, a window size of 128 samples in view of a first threshold $TH_A = 0.15$ can be used, or a window size of 64 samples for a first threshold equal to $TH_A = 0.075$ is applicable. That is, for a smaller window size, a smaller $TH_A$ correspondingly has to be selected.

That means a reliable method for detecting cycle slips is recommended which is also applicable in the presence of intersymbol interference, low signal to noise ratio and frequency offset. Reasons for said improved cycle slip detection are the robustness against intersymbol interference, low signal to noise ratio and frequency offset. The loop filter LF is a low pass filter and already filters out timing error estimation noise, however, this is strengthened by averaging timing errors in small windows. Comparing the changes as well as an evaluation of significant changes, consequently increase the system robustness against timing error estimation noise.

Figure 4:
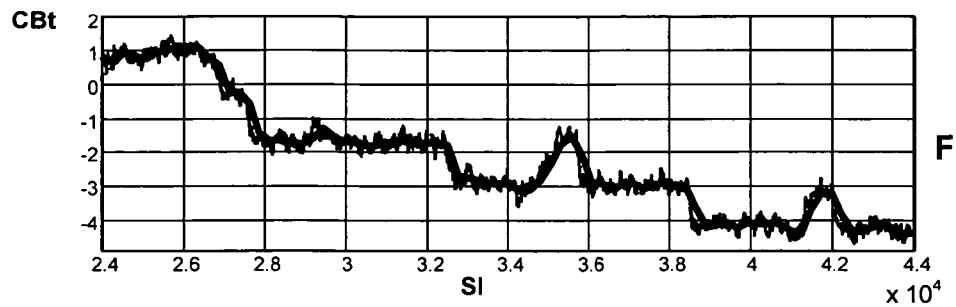
Figure 5:
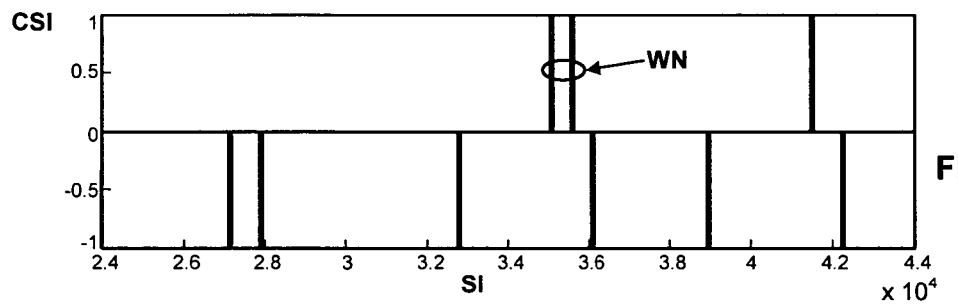
Figure 6:
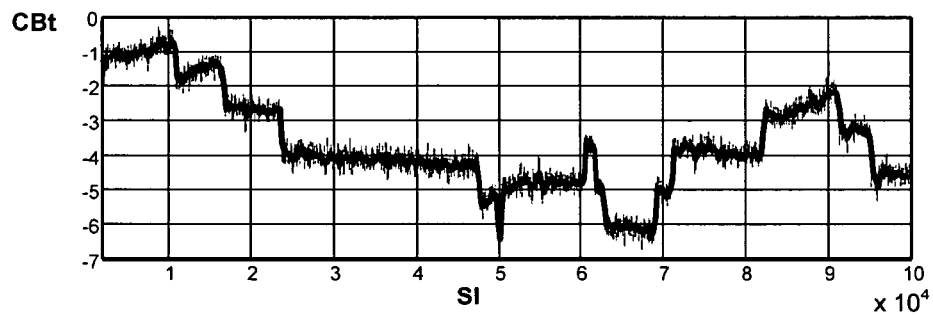
Figure 7:
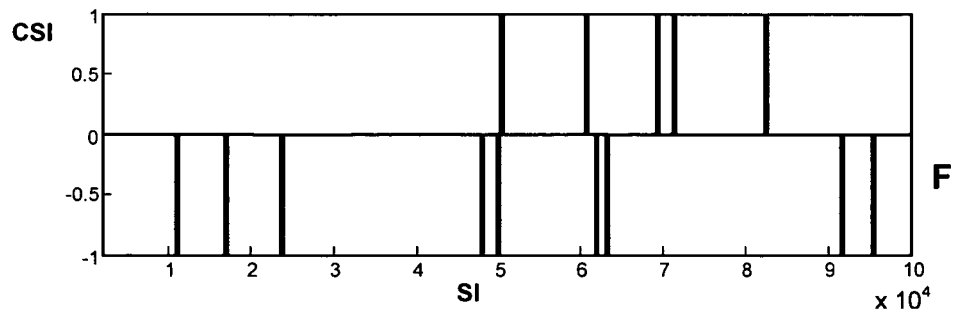

An example of filtered timing errors and the average thereof normalized with respect to the channel bit duration CBt for sample indexes SI running from 24000 to 44000 is shown in FIG. 4. A block length or a window equal to 256 samples to form average values, a first threshold equal to $TH_A = 0.15$ and a second threshold equal to TH=0.60 result in detection of cycle slips CSI as shown in FIG. 5.

Although the recommended cycle slip detection reliably detects cycle slips CSI in the presence of intersymbol interference, low signal to noise ratio and frequency offset, the number of cycle slips is wrongly detected. The number of wrongly detected cycle slips WN is indicated by a circle surrounding said cycle slips in FIG. 5. That means at a first glance that the recommended method for cycle slip detection is not applicable for cycle slip correction. However, it has been found that the associated problem is that the second threshold used for indicating a cycle slip TH=0.60 is relatively small for continuous changes in the same direction. In the worst case, a continuous change of averaged timing errors $S_A = 1.2$ will be detected as two successive cycle slips, while actually there is only one. Therefore, a third threshold or so-called tolerance threshold $TH_{tol}$ is used to avoid a false determination of the cycle-slip size i.e. a false determination of the number of bit shifts during successive changes of timing errors in the same direction. If an accumulated change is less than this tolerance threshold $TH_{tol}$, only one cycle slip is indicated. That means that a modified version of the recommended method as shown in FIG. 9 is used for cycle-slip compensation.

Figure 9:
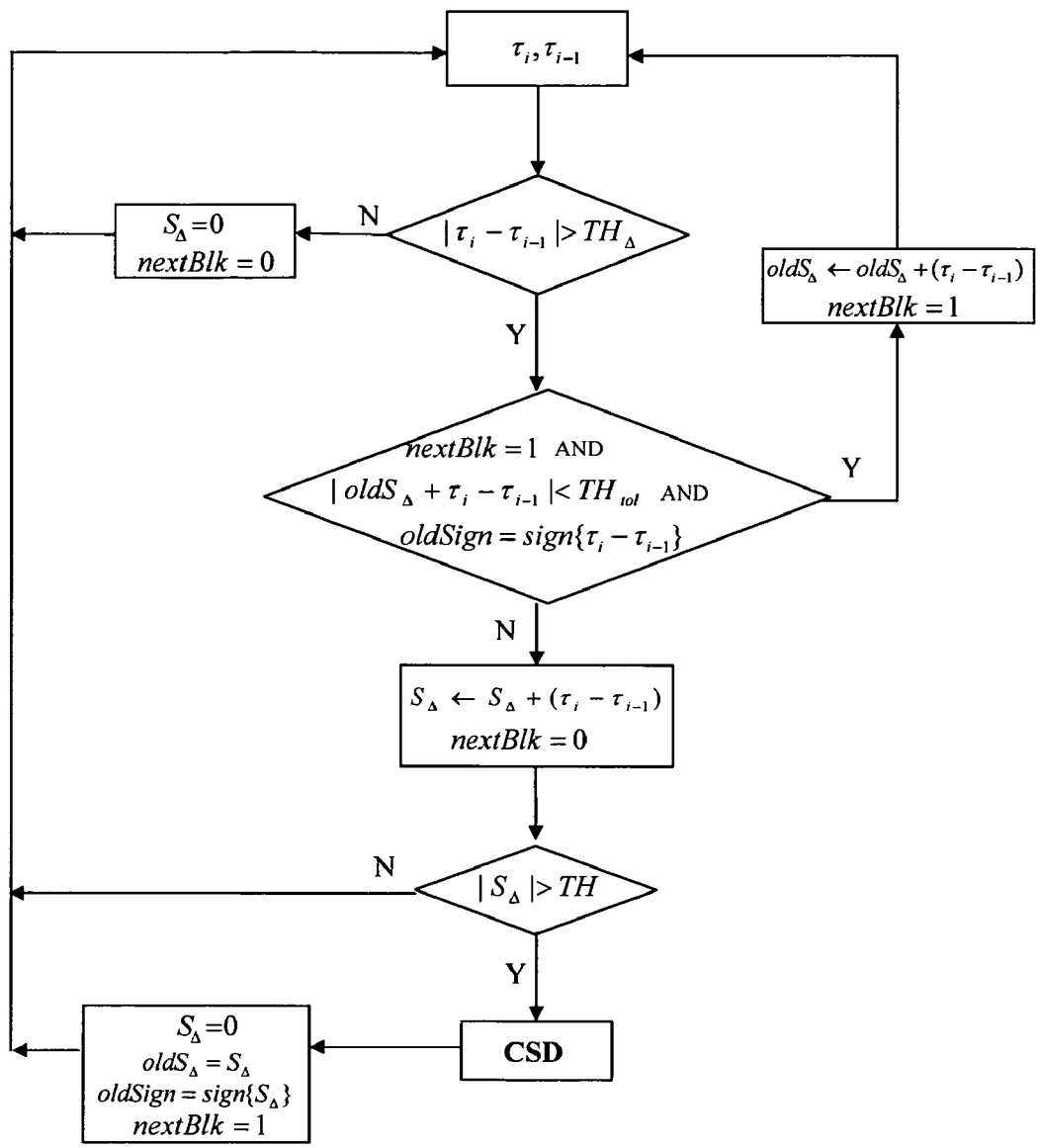

The modified cycle-slip detection illustrated by the flowchart in FIG. 9 is carried out with following steps:

1. Initialization: i=1, $\tau_0=0$, $S_A=0$, nextBlk=0, where $\tau_0$ is introduced only for consistence of $\tau_i - \tau_{i-1}$ to deal with the first block of samples. A new variable nextBlk is introduced to indicate the blocks following a previously detected cycle slip. The variable nextBlk=1 is relevant to avoid detecting a wrong number of cycle slips during a successive change in the same direction.

2. If there is a significant change with respect to the averaged filtered timing error between two adjacent blocks, i.e., $|\tau_i - \tau_{i-1}| > TH_A$, go to step 4 otherwise reset the change to $S_A = 0$ and set nextBlk=0.

It is also possible to define two thresholds for changes in two directions as mentioned above.

3. Increase the block index i=i+1, and go to step 2.

4. Three conditions are considered:

nextBlk=1, that is, the current block is the very next block of the previously detected cycle slip.

oldSign=sign$\{\tau_i - \tau_{i-1}\}$ indicates that the current change is in the same direction as the previously detected cycle slip, where oldSign denotes the direction of the last detected cycle slip.

$|oldS_A + \tau_i - \tau_{i-1}| < TH_{tol}$ indicates that the continuous change in the same direction does not exceed a tolerance range, predetermined by the tolerance threshold $TH_{tol}$ and wherein $oldS_A$ denotes the accumulated timing error change for the last cycle slip.

If all three conditions are fulfilled, no update is carried out for the accumulated timing error change, the variable nextBlk is set nextBlk=0 and the accumulated timing error change for the last cycle slip is updated $oldS_A \leftarrow oldS_A + \tau_i - \tau_{i-1}$ then go to step 3; Otherwise $S_A \leftarrow S_A + (\tau_i - \tau_{i-1})$ and nextBlk=0.

5. Check the cycle slip condition: If the magnitude of $S_A$ is larger than the second threshold TH, declare a cycle slip detected and set $oldS_A = S_A$, oldSign=sign$\{S_A\}$, nextBlk=0, $S_A=0$ then go to step 3.

That means that the modification of the recommended method provides in addition to the detection of cycle slips also the correct number of cycle slips, which makes the method also applicable for reliable cycle slip compensation or in other words for reliable timing recovery.

As already mentioned above, two thresholds may be employed to detect cycle slips in positive or negative directions.

That means that when a cycle slip is detected, sign and magnitude of the accumulated timing error change are applicable for sample insertion or sample deletion for cycle-slip compensation and reliable timing recovery.

For timing recovery, the output of the interpolator IP is connected to a first-in, first-out memory FIFO, wherein data are controlled according to cycle slips detected concerning direction and number of cycle slips as shown in FIG. 8.

According to an embodiment of the invention applicable for bit detection Bd with channel knowledge as shown in FIG. 10, in addition to the elements shown in FIG. 8, a partial response equalizer PREQ is embedded in the interpolated timing recovery loop. The equalizer PREQ shapes the overall channel impulse response to a desired partial response target, so that the equalizer PREQ output equals to the convolution of channel bits with the partial response target plus filtered additive noise. Therefore, as shown in FIG. 10, the symbol detector SyD of FIG. 8 is replaced by a partial response level detector PRLd.

The re-sampling timing at the interpolator IP is adjusted by a digital phase locked loop comprising a timing error detector TED, a loop filter LF, and a numerically controlled oscillator NCO and cycle slips are corrected by said first-in, first-out memory FIFO.

Figure 13:
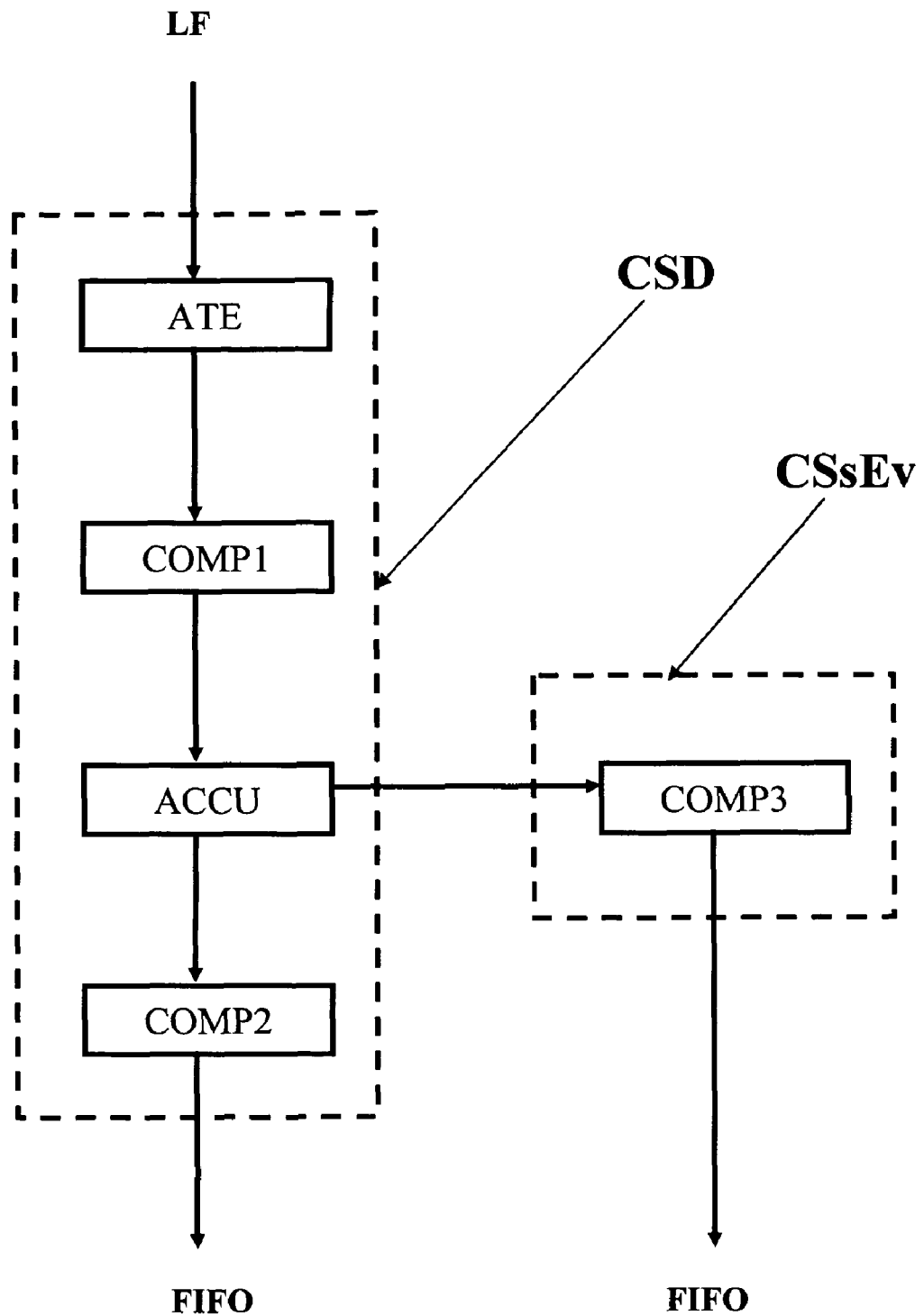

An arrangement for a cycle slip detector CSD connected to the loop filter LF of the control loop for timing recovery and a cycle slip size evaluator CSsEv connected to said cycle slip detector CSD is illustrated in FIG. 13. According to the method illustrated above, the cycle slip detector CSD comprises an averaged timing error value generating means ATE for generating averaged timing error values from the filtered timing error signal provided by the loop filter LF. The output of the averaged timing error value generating means ATE is connected to a first comparator COMP1 for comparing a difference between a current averaged timing error value and a previous averaged timing error value with a first threshold $TH_A$ which is connected to an accumulator ACCU for accumulating averaged timing error values successively exceeding the first threshold $TH_A$. For providing a cycle slip detection signal, said accumulator ACCU is connected to a second comparator COMP2 comparing accumulated averaged timing error changes $S_A$ with a second threshold TH and for determining a number of cycle slips, said accumulator ACCU is connected to cycle slip size evaluator CSsEv, which is formed by a third comparator COMP3 comparing accumulated averaged timing error changes $S_A$ with a third threshold $TH_{tol}$. The output of the second comparator COMP2 forms the output of the cycle slip detector CSD providing a cycle slip detection signal e.g. for a connected first-in, first-out memory FIFO and the output of the third comparator COMP3 is the output of the cycle slip size evaluator CSsEv providing a signal according to the number of detected cycle slips. The averaged timing error value generating means ATE of the cycle slip detector CSD is e.g. a well known and therefore not shown means for generating average values as accumulator to accumulate values and a counter to determine right shifting of the values for generating averaged values.

Advantages of the proposed method and arrangement for cycle slip detection for timing recovery are increased robustness against noise and inappropriately chosen timing loop parameters, applicability for systems with frequency-offsets as well as an improved signal integrity and system performance. Further advantages of the recommended timing recovery are the fully digital implementation and that a sample insertion or sample deletion takes place in the sample domain with increased reliability. The embodiments described here are specified as examples and a person skilled in the art can realize other embodiments of the invention which remain within the scope of the invention as specified in the appended claims.

The invention claimed is:

1. A method for cycle slip detection with a digital implemented timing recovery unit having a loop filter (LF) in a timing recovery control loop providing a filtered timing error signal and a cycle slip detector, the method comprising:
    generating, by the cycle slip detector, averaged timing error values from said filtered timing error signal,
    accumulating, by the cycle slip detector, changes of the averaged timing error values in adjacent blocks which exceed a first threshold ($TH_A$) and
    declaring, by the cycle slip detector, a cycle slip if the accumulated averaged timing error changes ($S_A$) of the adjacent blocks exceed a second threshold (TH).

2. The method according to claim 1, wherein the filtered timing error signal is divided into blocks of samples to generate an averaged timing error value for a block.

3. The method according to claim 1, wherein a low pass filter is used to generate the averaged timing error values from the filtered timing error signal.

4. The method according to claim 1, wherein the averaged timing error value changes ($\tau_i - \tau_{i-1}$) between two adjacent blocks are compared and the result of said comparison is reset to zero if the difference not exceeds the first threshold ($TH_A$).

5. The method according to claim 1, wherein a direction of cycle slip is determined according to a sign of the accumulated averaged timing error changes ($S_A$).

6. The method according to claim 1, wherein the accumulated averaged timing error changes ($S_A$) are compared with a third threshold ($TH_{tol}$) to determine the number of cycle slips.

7. The method according to claim 1, wherein the accumulated averaged timing error changes ($S_A$) which exceed the second threshold (TH), a sign of accumulated averaged timing error changes ($S_A$) and a comparison of accumulated averaged timing error changes ($S_A$) with a third threshold ($TH_{tol}$) are used for sample insertion or deletion in a first-in, first-out memory (FIFO) to perform cycle-slip compensation for timing recovery.

8. An arrangement for cycle slip detection with a digital implemented timing recovery unit having a loop filter (LF) in a timing recovery control loop providing a filtered timing error signal and a cycle slip detector, wherein the cycle slip detector comprises:
    an averaged timing error value generating means (ATE) for generating averaged timing error values from said filtered timing error signal is provided,
    a first comparator (COMP1) for comparing a difference between a current averaged timing error value and a previous averaged timing error value with a first threshold ($TH_A$) is applied to an output of said averaged timing error value generating means (ATE),
    an accumulator (ACCU) for accumulating changes of averaged timing error values of adjacent blocks exceeding the first threshold ($TH_A$) is connected to the first comparator (COMP1) and
    a second comparator (COMP2) applied to an output of said accumulator (ACCU) provides a cycle slip detection signal if accumulated averaged timing error changes ($S_A$) exceed a second threshold (TH).

9. The arrangement according to claim 8, wherein the averaged timing error value generating means (ATE) comprises an accumulator to accumulate the filtered timing error values provided by said loop filter (LF) and a counter to determine right shifting of filtered timing error values for generating averaged timing error values.

10. The arrangement according to claim 8, further comprising a third comparator (COMP3) for determining a number of cycle slips by comparing the accumulated averaged timing error changes ($S_A$) with a third threshold ($TH_{tol}$).

11. The arrangement according to claim 8, wherein said cycle slip detector (CSD) is connected to a first-in, first-out memory (FIFO) and the first-in, first-out memory (FIFO) is connected to an output of a timing recovery means in a fully digital implemented timing recovery unit for controlling cycle slip compensation by sample insertion or deletion.

12. The arrangement according to claim 11, wherein said output of the timing recovery means is an output of an interpolator (IP) in the fully digital implemented timing recovery unit.

13. The arrangement according to claim 11, wherein said output of the timing recovery means is an output of a partial response equalizer (PREQ) arranged in the timing recovery control loop of said fully digital implemented timing recovery unit.

\* \* \* \* \*